United States Patent
Arbab et al.

(10) Patent No.: US 6,495,251 B1
(45) Date of Patent: *Dec. 17, 2002

(54) SILICON OXYNITRIDE PROTECTIVE COATINGS

(75) Inventors: Mehran Arbab, Allison Park, PA (US); Gary J. Marietti, Cheswick, PA (US); Paul A. Medwick, Pittsburgh, PA (US); Larry A. Miller, Sarver, PA (US)

(73) Assignee: PPG Industries Ohio, Inc., Cleveland, OH (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 72 days.

(21) Appl. No.: 09/058,440

(22) Filed: Apr. 9, 1998

Related U.S. Application Data (60) Provisional application No. 60/050,298, filed on Jun. 20, 1997.

(51) Int. Cl.[7] ............................................. B32B 17/06
(52) U.S. Cl. ...................... 428/336; 428/212; 428/472; 428/697; 428/698; 428/699
(58) Field of Search ................... 428/698, 336, 428/432, 472, 469, 697, 699, 212

(56) References Cited

U.S. PATENT DOCUMENTS

| | | | |
|---|---|---|---|
| 4,055,407 A | 10/1977 | Heithoff et al. | |
| 4,187,336 A | * 2/1980 | Gordon | 428/432 |
| 4,320,155 A | 3/1982 | Gillery | |
| 4,512,863 A | 4/1985 | Criss et al. | |
| 4,594,137 A | 6/1986 | Gillery et al. | |
| 4,610,771 A | 9/1986 | Gillery | |
| 4,716,086 A | 12/1987 | Gillery et al. | |
| 4,786,563 A | 11/1988 | Gillery et al. | |
| 5,085,926 A | * 2/1992 | Iida et al. | 428/426 |
| 5,296,302 A | 3/1994 | O'Shaughnessy et al. | |
| 5,318,685 A | 6/1994 | O'Shaughnessy | |
| 5,344,718 A | 9/1994 | Hartig et al. | |
| 5,376,455 A | 12/1994 | Hartig et al. | |
| 5,417,827 A | 5/1995 | Finley | |
| 5,425,861 A | 6/1995 | Hartig et al. | |
| 5,514,476 A | 5/1996 | Hartig et al. | |
| 5,543,229 A | * 8/1996 | Ohsaki et al. | 428/472 |
| 5,552,180 A | * 9/1996 | Finley et al. | 427/165 |
| 5,563,734 A | 10/1996 | Wolfe et al. | |
| 5,584,902 A | 12/1996 | Hartig et al. | |
| 5,599,387 A | * 2/1997 | Neuman et al. | 106/287.14 |
| 5,688,585 A | 11/1997 | Lingle et al. | |
| 5,709,930 A | * 1/1998 | DePauw | 428/698 |
| 5,744,215 A | * 4/1998 | Neuman | 428/432 |
| 5,800,933 A | 9/1998 | Hartig et al. | 428/622 |
| 5,834,103 A | 11/1998 | Bond et al. | 428/216 |
| 6,090,481 A | * 7/2000 | Depauw et al. | 428/212 |

FOREIGN PATENT DOCUMENTS

| | | | |
|---|---|---|---|
| EP | 0 501 632 | * | 2/1992 |
| EP | 0 536 607 | | 4/1993 |
| EP | 0 796 825 | | 9/1997 |
| EP | 0 854 202 | | 12/1997 |
| JP | 63-242948 | | 10/1988 |
| WO | WO 95/29883 | | 11/1995 |

* cited by examiner

Primary Examiner—Archene Turner
(74) Attorney, Agent, or Firm—Donald C. Lepiane (57) ABSTRACT

A layer for protecting an underlying functional coating stack for example a single silver layer or double silver layer Low-E coating stack includes silicon oxynitride or silicon aluminum oxynitride layer. The protective film may have a uniform composition throughout its thickness i.e. homogeneous protective layer, a constantly increasing or decreasing index of infraction throughout its thickness i.e. a graded protective layer, or a combination of all or some of the foregoing i.e. a non-homogeneous protective layer. The graded and non-homogeneous layers may have an outer surface of silicon nitride, silicon aluminum nitride, silicon dioxide, silicon oxynitride or silicon aluminum oxynitride. The protective layer of the invention may be the last layer deposited on the functional coating stack or may have a film deposited thereon.

34 Claims, 3 Drawing Sheets

SILICON OXYNITRIDE PROTECTIVE COATINGS

RELATED APPLICATIONS

This application claims the benefit of the filing date of Provisional Application Serial No. 60/050,298 filed Jun. 20, 1997, in the names of Mehran Arbab, Paul A. Medwick, Larry A. Miller and Gary J. Marietti.

FIELD OF THE INVENTION

This invention relates to a layer or film to protect underlying functional coating layer(s) or film(s) and, in particular, to a sputter coated silicon oxynitride protective layer to protect underlying low emissivity coating film(s).

DISCUSSION OF THE AVAILABLE TECHNOLOGY

Vacuum deposited low emissivity ("Low-E") coating stacks usually consist of the following general layer sequence: $S/(D_1/M/P/D_2)^R$ where:

S is a substrate usually a transparent substrate such as glass;

$D_1$ is a first transparent dielectric layer usually a metal oxide and may include one or more transparent dielectric films;

M is an infrared reflective layer usually silver or other noble metal;

P is a primer layer to protect the underlying infrared reflective layer in a reactive plasma;

$D_2$ is a second transparent dielectric film similar to $D_1$; and R is an integer equal to or greater than one and is the number of repetitions of the above layers.

The dielectric layers, $D_1$ and $D_2$, adjust the optical properties of the coating stack. These layers also provide some physical and chemical protection to the fragile infrared reflective layer(s) which are usually silver layer(s). Unfortunately, many process-friendly and cost-effective dielectric materials are often susceptible to abrasion and corrosion as well. For example, zinc oxide e.g., as disclosed in U.S. Pat. No. 5,296,302, which usually forms a crystalline film, is susceptible to attack by acids and bases; bismuth oxide, which usually forms an amorphous film, is soluble in certain acids; tin oxide, which usually forms an amorphous film, is susceptible to attack in certain basic environments.

To reduce corrosion, some Low-E coating stacks have an overlaying protective overcoat of a chemically resistant dielectric layer. This layer preferably has desirable optical properties, manageable sputter deposition characteristics, and is compatible with other materials of the coating stack. The titanium dioxide films disclosed in U.S. Pat. Nos. 4,716,086 and 4,786,563 are protective films having the above qualities. There are other chemically resistant materials that have limitations, e.g., are more challenging to sputter. Silicon oxide disclosed in Canadian Patent No. 2,156,571, aluminum oxide and silicon nitride disclosed in U.S. Pat. Nos. 5,425,861; 5,344,718; 5,376,455; 5,584,902 and 5,532,180 and in PCT International Publication No. WO 95/29883 are examples of such materials. New sputtering deposition techniques in recent years, e.g., cylindrical magnetrons and dual planar magnetrons, have made the deposition of nitrides and oxides of silicon more practical. As a result of such new sputtering techniques, Low-E coating stacks with silicon nitride as one, or all, of the dielectric layers (D), and without additional protective overcoats, have been disclosed e.g. in U.S. Pat. Nos. 5,563,734 and 5,514,476.

In the instance where a protective layer or dielectric layer includes silicon, the cathode used in the sputtering process usually includes an alloy element to facilitate sputtering the silicon cathode. An alloying element used is aluminum, while other elements, e.g., boron and some transition metals, have also been used. U.S. Pat. No. 5,417,827 discloses a silicon nickel alloy. Although silicon nitride is chemically durable, the nitrides of the alloying element which may be present in the coating layer may not show the same level of durability e.g., aluminum nitride decomposes in hot water to form a hydroxide of aluminum.

As can now be appreciated, the above patents/patent applications disclose various protective layers or films to protect underlying coating layers and/or films; however, as was discussed, the presently available protective layers or films have limitations and/or drawbacks. It would be advantageous, therefore, to provide additional protective layers or films to protect underlying coating layers and/or films that minimize if not eliminate the limitations and/or drawbacks of the presently available protective layers.

SUMMARY OF THE INVENTION

This invention relates to an improved coated article having a functional coating on a substrate and a protective layer over the functional coating. The improvement is a protective layer of silicon oxynitride or silicon aluminum oxynitride. The protective layer of the instant invention may be homogeneous, graded or non-homogeneous, each term is defined herein. The protective layer of the instant invention may be the last layer or film deposited on a coating stack or a film under the last layer or film deposited.

The invention further relates to the method of depositing the protective layer.

DETAILED DESCRIPTION OF THE INVENTION

The instant invention relates to a protective layer or film that protects all or selected ones of the underlying coating layers or films from mechanical wear and/or chemical attack. In the following discussion the term "coating stack" or "stack" includes one or more coating layers and/or coating films. "Coating layer" or "layer" includes one or more coating films or films. In the following discussion, the embodiments of the invention will be discussed to protect underlying infrared reflective metal layers and metal oxide layers of the type present in products sold by PPG Industries, Inc. under its registered trademark SUNGATE; however, as will be appreciated by those skilled in the art, the invention is not limited thereto and may be used over any type of coating layers. For example, the present invention may be used on coatings having the general configuration:

glass/M1/M3/silicon(M2)dielectric;
where
M1 is a semiconductor or metal alloy or combination thereof;
M2 is an element combined with silicon in the silicon alloy target; and
M3 is the metallic metal compound to be protected from oxidation and to be stabilized during high temperature processing such as tempering.

An optional intermediate layer may be deposited between the metal compound and the silicon-based dielectric material.

The invention will now be discussed to protect underlying infrared reflective metal layer e.g. silver or gold and metal oxide layer usually found in coated articles referred to as low E coated articles.

Figure 1:
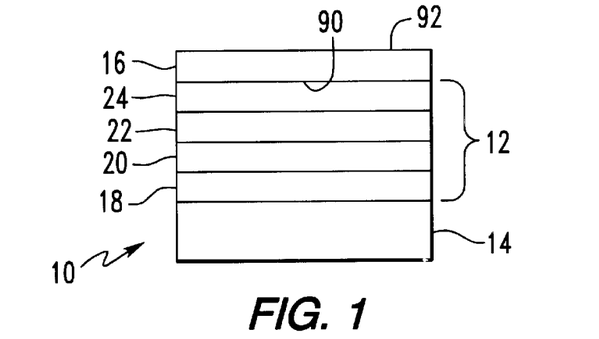
FIGS. 1–3 are side elevated views of coated articles incorporating features of the invention.

With reference to FIG. 1, there is shown article 10 having a sputtered Low-E coating stack 12 on a substrate 14, and a protective layer 16 of the instant invention over the coating stack 12. The substrate 14 may be made of any material, e.g., plastic, glass, metal or ceramic. In the practice of the invention, the substrate is preferably transparent, e.g., nylon, glass or Mylar® plastic sheet. In the following discussion, the substrate is glass. The glass may be of any composition having any optical properties, e.g., any value of visible transmittance, ultraviolet transmission, infrared transmission and/or total solar energy transmission. Types of glasses that may be used in practice of the invention, but not limited thereto, are disclosed in U.S. Pat. Nos. 4,746,347; 4,792,536; 5,240,886; 5,385,872 and 5,393,593 which disclosures are hereby incorporated by reference.

The sputtered coating stack 12 may have any arrangement and as shown in FIG. 1 includes, but is not limited to, a base layer 18 also referred to as a dielectric layer, a phase matching layer or an antireflective layer; an infrared reflecting metal layer 20 usually a silver film but may be any noble metal; a primer or protective layer 22 which may be, but not limited to, a deposited stainless steel film, a deposited copper film or a deposited titanium film and a second dielectric layer or antireflective layer 24. Coating stacks 12 that are single silver film coating stacks that may be used in the practice of the invention, but not limiting to the invention are disclosed in U.S. Pat. Nos. 4,320,155; 4,512,863; 4,594,137 and 4,610,771. The disclosures of the patents are hereby incorporated by reference.

For SUNGATE® 100 coated glass, the layers 18 and 24 are zinc stannate; the primer layer 22 is deposited as metallic copper and the layer 20 is silver. The layer 18 is preferably deposited on the air surface of a glass sheet cut from a float glass ribbon. The air surface is the surface opposite the surface of the float ribbon supported on the molten pool of metal e.g. as disclosed in U.S. Pat. No. 4,055,407. The coating stack 12 described above is disclosed in the above-mentioned U.S. Pat. Nos. 4,610,771 and 4,786,563.

The protective layer 16 of the instant invention discussed in detail below is deposited over the coating stack 12.

Figure 2:
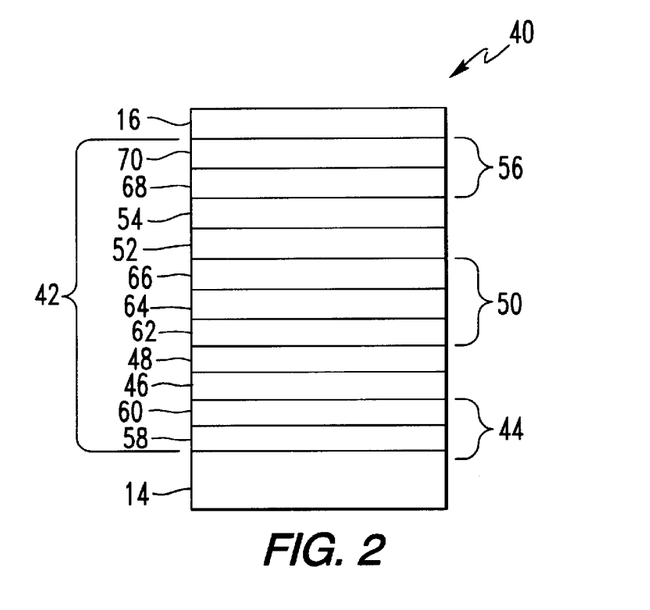

With reference to FIG. 2 there is shown a coated article 40 having coating stack 42 usually found in Low E sputter coated articles having two infrared reflective metal layers. The coating stack 42 is carried on the substrate 14. In general, the coating stack 42 includes a base layer 44 which may include one or more films of different dielectric materials or antireflective materials or phase matching materials, a first infrared reflective metal layer 46, a primer layer 48 to prevent degradation of the metal layer 46 during sputtering of a dielectric layer or antireflective layer or phase matching layer 50. The dielectric layer 50 may have one or more films. A second infrared reflective metal layer 52 is deposited over the layer 50. A second primer layer 54 is deposited on the second infrared metal reflective layer 52 and a dielectric layer or antireflective layer 56 is deposited over the second primer layer 54.

With continued reference to FIG. 2, a double metal layer reflective coating stack that is preferably used in the practice of the invention includes a zinc stannate film 58 on the air surface of a glass substrate 14 cut from a float glass ribbon; a zinc oxide film 60 on the zinc stannate film 58; a silver film 46 on the zinc oxide film 60; sputtered titanium metal film on the silver film 46, the titanium metal oxidizes to titanium dioxide film 48 during sputtering of the next dielectric film i.e. a zinc oxide film; a zinc oxide film 62 on the primer layer 48; a zinc stannate film 64 on the zinc oxide film 62 and a zinc oxide film 66 on the zinc stannate film 64; a silver film 52 on the zinc stannate film 64; a titanium metal film 54 deposited on the silver film 64 which is oxidized to titanium dioxide as previously discussed; a zinc oxide film 68 over the titanium oxide film 54 and a zinc stannate film 70 on the zinc oxide film 68. The coating stack 42 is of the type disclosed in published EPO Application No. 0 803 381 based on U.S. patent application Ser. No. 08/807,352 filed on Feb. 27, 1997, in the names of Mehran Arbab, Russell C. Criss and Larry A. Miller for "Coated Articles" which patent application is hereby incorporated by reference and in products sold by PPG Industries, Inc., under its trademark SUNGATE® 1000 coated glass, and SUNGATE® 100T coated glass.

The protective layer or film 16 of the instant invention discussed in more detail below is deposited over the coating stack 42.

Figure 3:
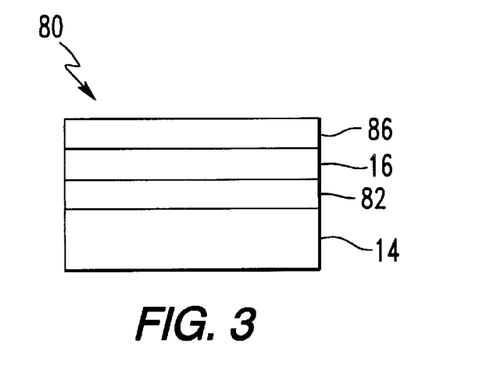

Shown in FIG. 3 is coated article 80. The article 80 includes the substrate 14, a functional coating 82 e.g. of the types discussed in FIGS. 1 and 2 and the protective layer 16 incorporating features of the invention. The deposition of the functional coating 82 is not limiting to the invention and may be deposited by any method, e.g. by sputter deposition, electroless metal deposition, and/or pyrolytic deposition.

The protective layer 16 of the instant invention may be the last deposited layer on the coating stack or may be an underlying layer for outermost layer 86 as shown in FIG. 3. For example and with continued reference to FIG. 3, the protective layer 16 of the instant invention is deposited on the last film of the functional coating 82 to provide protection against mechanical and chemical attack equal to and better than presently known and used protective films; however, there may be other films that may provide better mechanical durability than the protective layer of the invention but not as good chemical durability as the protective layer of the instant invention. In this instance, where the coating stack during shipping, handling or use will be exposed to harsh mechanical conditions and chemical conditions, a thin layer e.g. the outer layer 86 may be used to provide mechanical durability and the protective layer 16 under the outer layer 86 provides chemical protection as well as mechanical protection. By way of further illustration, U.S. Pat. No. 5,318,685 alleges that zinc oxide provides mechanical protection. While the coated product is being shipped, mechanical durability may be provided by the alleged properties of a zinc oxide film, and chemical and additional mechanical protection provided by the protective layer of the instant invention. Prior to using the coated article the zinc oxide film 86 may be removed by washing and the protective layer 16 of the instant invention provides chemical and mechanical protection for the underlying coating stack.

The protective layer 16 incorporating features of the invention includes a silicon oxynitride film represented by the following stoichiometric formula: $Si_{3-2X}O_{2X}N_{4-4X}$ where X is greater than 0 and less than 1. As can be appreciated by those skilled in the art, the silicon oxynitride layer discussed may include a single phase consisting of silicon, oxygen, and nitrogen, or a mixture of phases consisting of these elements, e.g. mixtures of silicon oxide, silicon nitride and/or nitrides or oxynitrides of the alloying elements. Further, as can now be appreciated by those skilled in the art, the protective layer of the instant invention may be deposited in any manner. In the practice of the invention, although not limiting thereto, the protective layer is deposited by magnetron sputtering or cathode sputtering.

Magnetron sputtering of a silicon target in an atmosphere of oxygen and nitrogen or in an atmosphere of nitrous oxide can result in a layer of silicon oxynitride depositing on the silicon target. When this occurs, the rate of sputtering significantly decreases. Radio Frequency (RF) magnetron sputtering reduces the problem. To minimize if not eliminate this problem in direct current (D.C.) magnetron sputtering which is the preferred sputtering technique for coating large areas, the target is made of an alloy of silicon and another element whose combination makes the target highly electrically conductive. Other elements include, but are not limited to aluminum, boron, and/or a transition metal e.g. nickel. In the practice of the invention, a target of silicon having about 15 weight percent aluminum was used. However, as can be appreciated by those skilled in the art, the invention is not limited to the weight percent of aluminum in the silicon target; however, sufficient aluminum should be present to keep the target conductive and still deposit the protective layer of the invention. Silicon targets having about 1–50% and preferably 1–25% by weight aluminum or other suitable alloy elements are acceptable in the practice of the invention.

It has been determined that the weight percent of aluminum in the coating is less than the weight percent of aluminum in the target sputtered in a reactive atmosphere. The aluminum content of the film approaches that of the target when deposited in an inert atmosphere. The same is expected for cathode sputtering of a silicon target which may contain other suitable alloying elements. Sputtering a highly electrically conductive silicon alloy target in an atmosphere of oxygen and nitrogen or of nitrous oxide provides a sputtered coating having a compositional formula that includes silicon, oxygen, nitrogen and the suitable alloying element which in the practice of the invention is aluminum. Because of the complexity of the oxynitride of silicon with aluminum (hereinafter referred to as "silicon aluminum oxynitride" or "SiAlON") the exact compositional range of the elements of this compound has not been determined. The amount of silicon, and the percentage or amount of silicon and aluminum, in the SiAlON film may be determined by x-ray fluorescence; however, the percentage or amount of oxygen and/or nitrogen are more difficult to determine.

X-ray photoelectron spectroscopy (XPS) has been used to confirm the presence of oxygen and nitrogen in a sputtered silicon oxynitride and/or silicon aluminum oxynitride films of the instant invention. The concentrations of oxygen and nitrogen, however, have not been determined but may be inferred from measured index of refraction ("n"). For example, silicon nitride has an n of about 2 at a wavelength of 550 nanometers, hereinafter represented by $n_{550}$, and silicon dioxide has an $n_{550}$ of about 1.46. Silicon aluminum nitride is expected to have an $n_{550}$ of about 2 based on silicon nitride having an $n_{550}$ of about 2 and aluminum nitride having an $n_{550}$ of about 2. Silicon aluminum oxide is expected to have an $n_{550}$ between 1.46 and about 1.7 based on silicon dioxide having an $n_{550}$ of about 1.46 and aluminum oxide having an $n_{550}$ of about 1.7. It is expected that the protective layer of the invention will be within the above ranges, more particularly, silicon oxynitride protective film is expected to have an $n_{550}$ within the range of about 1.46–2 and silicon aluminum oxynitride protective film is expected to have an $n_{550}$ within the range having a lower limit of greater than about 1.46 and an upper limit equal to or less than about 2.

In the practice of the invention, silicon with combinations of oxides, nitrides and oxynitrides may be used to provide the protective film of the instant invention. As discussed in the following, silicon nitride or combination of oxide, nitride or oxynitride as protective layers offer durable coatings with increased flexibility in the choice of color and reflectance.

The protective layer of the instant invention may be "homogeneous", "graded" or "non-homogeneous". With reference to FIG. 1, surface 90 of the protective layer, the surface closest to the substrate and part of the interface between the protective layer 16 and the layer 24 as shown in FIG. 1 is defined as bottom surface 90 of the protective layer 16; surface 92 opposite to the bottom surface 90 as viewed in FIG. 1 is defined as the top surface 92 of the protective layer. The protective layer is "homogeneous" when the top surface 92, the bottom surface 90 and portions of the protective layer 16 between the top surface 92 and bottom surface 90, have substantially the same chemical composition moving from the bottom surface 90 to the top surface 92 or vice versa. The protective layer is "graded" when the portion of the protective layer 16 between the top surface 92 and the bottom surface 90 has a chemical composition with a substantially increasing fraction of oxygen and decreasing fraction of nitrogen or vice versa moving from the top surface 92 to the bottom surface 90 and vice versa. The protective layer is "non-homogeneous" when the protective layer 16 is other than a homogeneous layer or a graded layer. A non-homogeneous layer includes, but is not limited to, selected portions of the protective layer 16 between the surfaces 90 and 92 being homogeneous and/or graded, and other portions of the protective layer 16 having variable chemical composition e.g., fractional changes of the concentration of oxygen, nitrogen, silicon and suitable alloying element, if present. As can be appreciated by one skilled in the art, the top surface 92 and/or the bottom surface 90 of the protective layer may be silicon, aluminum, silicon nitride, silicon dioxide, silicon oxynitride, silicon aluminum oxynitride, silicon aluminum nitride, or silicon aluminum oxide or combinations thereof.

From an optical point of view, in the practice of the invention, it is preferred that the protective layer of silicon aluminum oxynitride or silicon oxynitride be a graded layer. A graded layer within the scope of the invention may be provided in the following manner; however, the invention is not limited thereto. Further, the gas flow referenced is the gas flow into the coating chamber during sputtering unless indicated otherwise. The bottom surface 90 of the protective layer may be approaching or may be silicon aluminum nitride or silicon nitride. To deposit a protective layer, the oxygen and nitrogen contents of the gas are varied to provide a graded oxynitride layer, which may terminate in a top surface 92 of silicon aluminum oxide or silicon oxide when the nitrogen content during deposition of the surface is zero. Alternatively, the top surface 92 may consist of silicon oxynitride or silicon aluminum oxynitride when the nitrogen content during deposition of the surface is sufficiently greater than zero. In this instance, the $n_{550}$ at the bottom surface 90 in FIG. 1 is about 2, the $n_{550}$ for the top surface 92 in FIG. 1 may be as low as about 1.46 when the top surface 92 is silicon aluminum oxide or silicon dioxide and the top surface 92 preferably is silicon aluminum oxynitride or silicon oxynitride having a value within the range of about greater than about 1.46 and less than about 2.0 and more preferably greater than 1.7–1.8. Between the bottom and top surfaces 90 and 92 respectively, the $n_{550}$ continuously decreases from about 2.00 to about 1.46 or higher as discussed above. In the instance where the protective layer is homogeneous, a protective layer of silicon aluminum oxynitride or silicon oxynitride has an $n_{550}$ within the range discussed above. In the instance where the protective layer 16 is expected to be used in an extreme chemically corrosive environment, the bottom surface 90 may be silicon aluminum nitride or silicon nitride and as the protective layer 16 is deposited, the nitrogen content in the gas flow continually decreases and the oxygen content in the gas flow increases to provide a silicon aluminum oxynitride layer or a silicon oxynitride layer at the top surface. The $n_{550}$ at the bottom surface 90 is about 2, the $n_{550}$ at the top surface 92 about 1.7–1.8 and between the top and bottom surfaces 92 and 90 respectively, the $n_{550}$ varies between about 2.00 and 1.7–1.8.

As can be appreciated, in the above discussion the $n_{550}$ of the protective layer of the instant invention was considered; however, the protective layer 16 may also be considered using optical thickness ("OT"). For a homogeneous protective layer, the OT is the $n_{550}$ of the protective layer times its physical thickness. For a graded protective layer or a non-homogeneous protective layer, the OT may be determined by the following formula or by actual measurements. The OT of a graded and non-homogeneous protective layer may be determined using following equation (1):

$$OT=\int_0^t n_{550}(t')dt' \quad (1)$$

where:
OT is optical thickness;

$n_{550}$ is index of refraction at a given wavelength at the given point t' in the protective layer;

t' is distance along a line normal to and between the surfaces 90 and 92, and t is the physical thickness of the protective layer.

As can be appreciated when the protective layer is homogeneous, Equation 1 may be rewritten as Equation 2 below:

$$OT=n_{550}t \quad (2)$$

where OT, $n_{550}$ and t are as previously discussed.

The graded layer and non-homogeneous protective layers of the instant invention allow for adjustment of the color of the article by varying the values of $n_{550}$ and physical thickness of the protective layer 16, and a homogeneous layer allows for adjustment of color by varying the physical thickness.

A designed experiment was conducted to examine the variations of homogeneous silicon aluminum oxynitride layer properties as a function of the oxygen content in the gas flow during sputtering. In the following, the gas flow into the sputtering chamber was measured; the actual atmosphere in the sputter chamber was not known. All samples in the following discussion unless indicated to the contrary were coated using an in—line laboratory coating apparatus having two Airco ILS 600 chambers. Twenty-one (21) pieces of 12 inch (0.3 meter)×12 inch (0.3 meter)×0.0092 inch (2.3 mm) thick clear soda-lime silicate glass were provided. Deletion lines were made on each glass piece running the length of the pieces equally spaced from the edges of the pieces with an acetone-soluble ink prior to sputter coating the glass pieces. A piece of Mylar® plastic sheet 4 inches (10.2 cm) by 4 inches (10.2 cm)×0.005 inch (0.013 cm) thick was placed on the surface of each glass piece to be coated. The Mylar® sheet and deletion line were spaced from one another. Each sample was moved through the coating chamber five times i.e. five cathode passes were made for each sample. After coating, the coating over the ink was wiped away with an acetone soaked laboratory tissue to remove the deletion lines and the coating remaining on the glass piece provides a step to measure film thickness of the coating e.g. using a Tencor P1 stylus profilometer. The silicon aluminum oxynitride film deposited on the Mylar® plastic sheet was used for x-ray fluorescence (XRF) analyses. The Mylar® plastic sheet was used because unlike the glass piece it is free of silicon and aluminum.

Table 1 lists the percent oxygen ($O_2$) in the total gas flowing into the sputtering or coating chamber during sputtering of the pieces (Column 1), the power to the cathode during sputtering in kilowatts (kW) (Column 2), the cathode voltage (V) during sputtering (Column 3), the $n_{550}$ of the sputtered film (Column 4), the extinction coefficient (k) at a wavelength of 550 nm (Column 5), the physical thickness of the deposited film in Angstroms (Å) (Column 6) and the ratio of aluminum to total aluminum and silicon (Al/Al+Si) in the coating layer as deposited on the Mylar® plastic sheet in weight percent (%) (Column 7).

Figure 4:
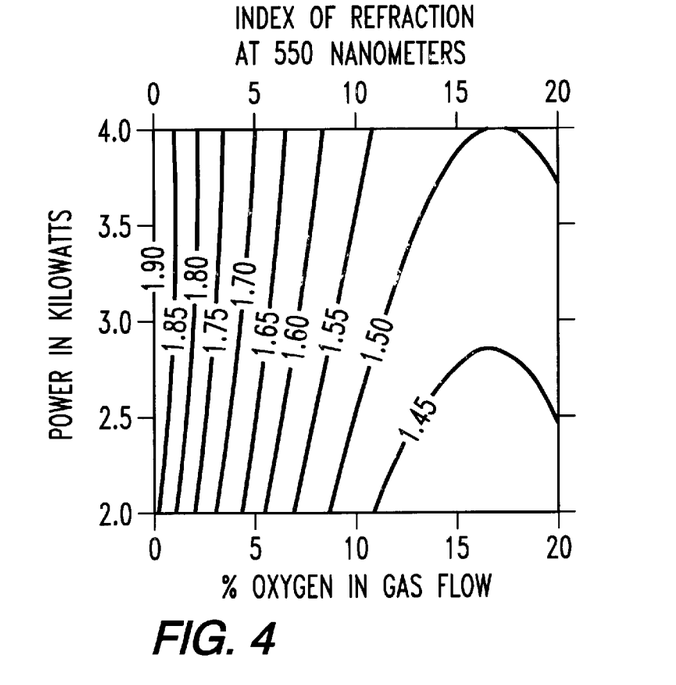
FIG. 4 is a contour plot showing the variation of refractive index of the protective coating embodying feature of the invention at wavelength of 550 nanometers ($n_{550}$) as a function of percent (%) oxygen in the gas flowing into the coating chamber during sputtering and sputtering power in kilowatt (kW) during deposition of the protective film embodying features of the invention.

The physical coating layer deposition rate may be obtained from the data on Table 1 by dividing the layer thickness by the product of sputtering power and number of cathode passes, which is five (5) passes. Optical deposition rate of the coating layer may be obtained from the data on Table 1 by multiplying the physical deposition rate by refractive index.

increase in the response surface with increasing sputtering power at constant oxygen flows suggests a possible increasing dependence of refractive index on sputtering power.

TABLE 1

| Sample No. | (1) O$_2$ Flow (%) | (2) Power (kW) | (3) Cathode Voltage (V) | (4) "n" at 550 nm | (5) "k" at 550 nm | (6) film thickness (Å) | (7) Ratio of Al/Al + Si (%) |
|---|---|---|---|---|---|---|---|
| 1  | 6  | 2.7 | 443 | 1.621 | 0.0001 | 258 | 6.6 |
| 2  | 0  | 3.0 | 447 | 1.921 | 0.0016 | 229 | 8.6 |
| 3  | 20 | 2.0 | 361 | 1.448 | 0.0000 | 145 | 4.9 |
| 4  | 6  | 3.3 | 441 | 1.644 | 0.0000 | 301 | 6.9 |
| 5  | 9  | 2.0 | 389 | 1.519 | 0.0007 | 178 | 5.4 |
| 6  | 0  | 3.0 | 446 | 1.906 | 0.0009 | 224 | 9.4 |
| 7  | 0  | 4.0 | 448 | 1.894 | 0.0024 | 297 | 9.3 |
| 8  | 20 | 4.0 | 375 | 1.510 | 0.0011 | 355 | 4.8 |
| 9  | 9  | 4.0 | 442 | 1.534 | 0.0012 | 458 | 6.7 |
| 10 | 20 | 2.0 | 360 | 1.414 | 0.0045 | 140 | 5.8 |
| 11 | 9  | 2.0 | 383 | 1.472 | 0.0025 | 164 | 6.3 |
| 12 | 6  | 4.0 | 435 | 1.666 | 0.0030 | 312 | 8.8 |
| 13 | 20 | 3.0 | 359 | 1.470 | 0.0034 | 205 | 6.2 |
| 14 | 20 | 3.0 | 358 | 1.457 | 0.0027 | 205 | 6.3 |
| 15 | 0  | 4.0 | 439 | 1.912 | 0.0020 | 270 | 11.2 |
| 16 | 12 | 2.7 | 386 | 1.468 | 0.0011 | 206 | 6.3 |
| 17 | 13 | 3.3 | 384 | 1.508 | 0.0030 | 270 | 7.3 |
| 18 | 0  | 2.0 | 428 | 1.862 | 0.0018 | 146 | 12.1 |
| 19 | 4  | 3.0 | 435 | 1.682 | 0.0006 | 252 | 10.1 |
| 20 | 14 | 3.0 | 370 | 1.506 | 0.0000 | 225 | 6.8 |
| 21 | 9  | 4.0 | 424 | 1.589 | 0.0024 | 326 | 9.1 |

The spectral reflectance from the coated glass surface and transmittance of samples 1–21 were measured over a wavelength range of 380–720 nanometers using a Spectrogard colorimeter. The refractive index was determined for each film by fitting the spectral data with a Cauchy parameterization over this wavelength interval. The extinction coefficient k was determined for each film by fitting the spectral data with an exponential parameterization over the same wavelength range; fitting was done using the VASE software from J. A. Woollam Company, Lincoln, Nebr.

FIG. 4 is a contour plot showing the variation of $n_{550}$ as a function of percent % oxygen in the gas flow in standard cubic centimeters per minute (sccm) and sputtering power during sputtering in kW. The contour plot of FIG. 4 was generated using a commercially available statistical analysis software package and is a response surface model fit through the refractive index, oxygen flow and power data of Table 1. Contours of FIG. 4 show a decrease in the refractive index of the deposited film as the percent of oxygen in the gas flow increases from 0% to 20%. Note that above 10–12% oxygen in the gas flow, the rate-of-change in refractive index appears to level off. At all power levels and between 0 and 15% oxygen flow the refractive index decreases with increasing percent of oxygen in the gas flow. A slight The absorption of the oxynitride layers is low as evidenced by small extinction coefficients (k) listed in Column (5) of Table 1. The maximum k value is 0.0045 at a wavelength of 550 nm indicating that the oxynitride film is highly transparent and does not appreciably decrease the transmittance of the coated article by absorption when the protective layer is used.

Silicon and aluminum content of the coating layer on the Mylar sheet for samples 1–21 was quantified by x-ray fluorescence (XRF) and is reported on Table 2. With reference to Table 2, column 1 lists the mass of silicon (Si) in micrograms per square centimeters ($\mu g/cm^2$) in the coating layer on the plastic sheet. Column 2 lists the mass of aluminum (Al) in micrograms per square centimeters ($\mu g/cm^2$) in the coating layer on the plastic sheet. Column 3 lists the ratio in percent of the mass of aluminum (Al) to total mass of aluminum (Al) plus silicon (Si) (Al/Al+Si) in the coating layer on the Mylar® plastic sheet. Column 4 lists the mass of aluminum (Al) in micrograms per square centimeters ($\mu g/cm^2$) for the coating layer on glass ("cfg") before the hot salt water test discussed below. Column 5 is the mass of aluminum (Al) in micrograms per square centimeters ($\mu g/cm^2$) for the coating layer on the cfg after the hot salt water test. Column 6 is the weight percent loss of aluminum from the coating on cfg after the hot salt water test.

TABLE 2

| Sample | (1) [Si] ($\mu g/cm^2$): film on Mylar sheet | (2) [Al] ($\mu g/cm^2$): film on Mylar sheet | (3) [Al]/[Si] + [Al] (%) | (4) Before-hot salt [Al] ($\mu g/cm^2$) film on cfg | (5) After-hot salt [Al] ($\mu g/cm^2$) film on cfg | (6) % decrease [Al] film on cfg |
|---|---|---|---|---|---|---|
| 1 | 2.83 | 0.20 | 6.6 | 0.18 | 0.15 | 17 |
| 2 | 3.19 | 0.30 | 8.6 | 0.23 | 0.21 | 25 |
| 3 | 1.36 | 0.07 | 4.9 | 0.06 | 0.05 | 17 |
| 4 | 3.36 | 0.25 | 6.9 | 0.24 | 0.21 | 13 |
| 5 | 1.76 | 0.10 | 5.4 | 0.09 | 0.09 | 11 |

TABLE 2-continued

| Sample | (1) [Si] (μg/cm²): film on Mylar sheet | (2) [Al] (μg/cm²): film on Mylar sheet | (3) [Al]/[Si] + [Al] (%) | (4) Before-hot salt [Al] (μg/cm²) film on cfg | (5) After-hot salt [Al] (μg/cm²) film on cfg | (6) % decrease [Al] film on cfg |
|---|---|---|---|---|---|---|
| 6 | 3.09 | 0.32 | 9.4 | 0.31 | 0.23 | 26 |
| 7 | 3.99 | 0.41 | 9.3 | 0.41 | 0.33 | 20 |
| 8 | 2.99 | 0.15 | 4.8 | 0.13 | 0.12 | 8 |
| 9 | 3.76 | 0.27 | 6.7 | 0.25 | 0.05 | 80 |
| 10 | 1.31 | 0.08 | 5.8 | 0.08 | 0.06 | 25 |
| 11 | 1.65 | 0.11 | 6.3 | 0.10 | 0.10 | 0 |
| 12 | 3.71 | 0.36 | 8.8 | 0.35 | 0.31 | 11 |
| 13 | 1.98 | 0.13 | 6.2 | 0.12 | 0.11 | 8 |
| 14 | 1.93 | 0.13 | 6.3 | 0.12 | 0.11 | 8 |
| 15 | 3.79 | 0.48 | 11.2 | 0.47 | 0.39 | 17 |
| 16 | 2.10 | 0.14 | 6.3 | 0.14 | 0.12 | 14 |
| 17 | 2.68 | 0.21 | 7.3 | 0.19 | 0.17 | 11 |
| 18 | 1.89 | 0.26 | 12.1 | 0.24 | 0.15 | 38 |
| 19 | 2.84 | 0.32 | 10.1 | 0.30 | 0.25 | 17 |
| 20 | 2.19 | 0.16 | 6.8 | 0.15 | 0.13 | 13 |
| 21 | 3.16 | 0.36 | 9.1 | 0.32 | 0.29 | 9 |

Figure 5:
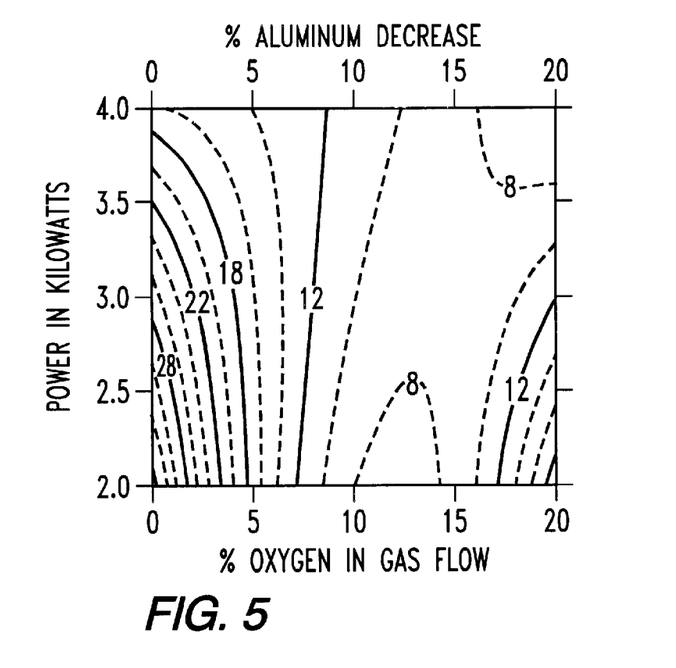
FIG. 5 is a contour plot of weight percent (%) aluminum loss from the protective coating embodying features of the invention after exposure to a heated sodium chloride solution as a function of percent (%) oxygen in the gas flowing into the coating chamber during sputtering and sputtering power in kilowatt (kW) during sputtering of the protective film embodying features of the invention.

For the hot salt water test two coated segments were cut from each of the glass pieces. The hot salt water test consists of placing the coated glass segments in a 2.5 weight percent (wt %) solution of sodium chloride in deionized water at 75° C. (167° F.) for 2.5 hours. The segments were removed, rinsed in deionized water and dried with pressurized nitrogen. The segments were then analyzed by an XRF method for aluminum loss. FIG. 5 is a contour plot using the data of Tables 1 and 2 for percent aluminum loss after the hot salt water test as a function of percent (%) oxygen in the gas flow in sccm and sputtering power in kW. The curves for FIG. 5 were generated in a similar manner as the curves of FIG. 4. A minimum aluminum loss is indicated at about 10–15%O$_2$ oxygen flow for about 2–3 kW sputtering power. At the highest power 4 kW, the aluminum loss continuously decreases with increasing % oxygen in the gas flow. It is believed the higher the aluminum loss, the less stable, less chemically durable the coating layer and vice versa.

Figure 6:
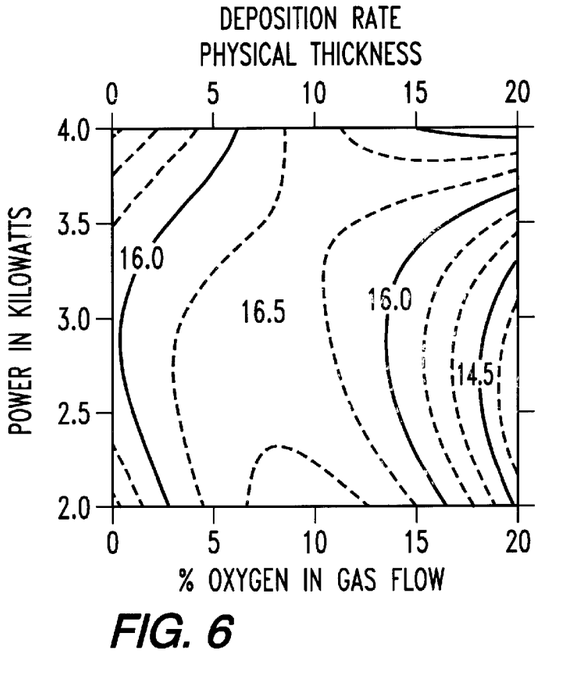
FIG. 6 is a contour plot of physical thickness deposition rate of the protective film embodying feature of the invention as a function of % of oxygen in the gas flowing into the coating chamber during sputtering and sputtering power in kilowatts (kW) during sputtering of the protective film embodying feature of the invention.

FIG. 6 is a contour plot using the data in Table 1 for physical rate of the coating as a function of % oxygen in the gas flow into the sputtering chamber during sputter in sccm and sputtering power in kW. The curves of FIG. 6 were generated in a similar manner as the curves of FIG. 4. The contour plot exhibits a change in curvature within the boundaries of the experimental design. At low power (2 kW), physical deposition rate first increases with increasing % oxygen in the gas flow, reaches a maximum at ~10% oxygen in the gas flow, then falls off. This suggests that oxygen is fully consumed by the sputtering process up to 10% oxygen in the gas flow at a power level of 2 kW; oxygen flows above 10% constitute an excess of oxygen with respect to the flux of silicon and aluminum atoms sputtered from the target which in turn is likely to result in a progressive oxidation of the target surface and reduced deposition rate. In contrast, deposition rate at high power (4 kW) continuously increases with increasing % of oxygen in the gas flow; no maximum in deposition rate is observed. This suggests that the flux of atoms sputtered from the silicon-aluminum alloy target is sufficiently high to fully consume all oxygen up to 20% oxygen in the gas flow at 4 kW. A transition between the two regimes occurs at intermediate power levels. As expected, the contour plot shows an increase in deposition rate as sputtering power is increased above 2.5 kW at high % oxygen in the flow e.g. 20% oxygen in the gas flow; an initial slight decrease in rate between 2–2.5 kW at 20% oxygen may be an artifact of the contour fitting. The plot of FIG. 6 may be used to optimize the deposition rate of the coating layer.

Figure 7:
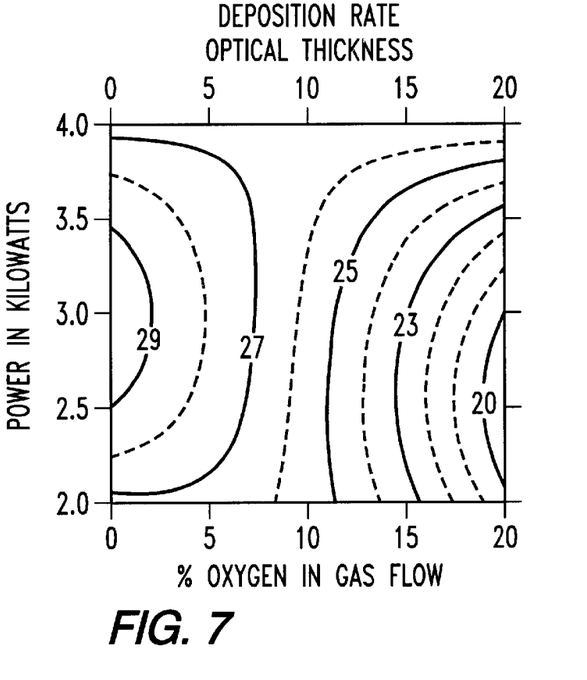
FIG. 7 is a contour plot of the optical thickness deposition rate of the protective film embodying feature of the invention as a function of % of oxygen in the atmosphere flowing into the sputter chamber and sputtering power in kilowatt (kW) during sputtering of the protective film embodying features of the invention.

FIG. 7 is a contour plot of optical deposition rate as a function of % oxygen flow in the gas during sputtering and sputtering power in kW. The curves for FIG. 7 were generated from the data of Table 1 in a similar manner as the curves of FIG. 4. FIG. 7 shows that at 0% and 20% oxygen in the gas flow, the variation of the optical deposition rate is similar to the physical deposition rate. This is to be expected based upon the fact that the refractive index (at constant oxygen content in the gas flow) is only weakly dependent upon sputtering power (See FIG. 4); hence, the trend in optical deposition rate at constant oxygen flow should be similar to that of physical deposition rate. In contrast, optical deposition rate continuously decreases at low sputtering power (2 kw) as oxygen % in the gas flow increases; this is a consequence of the decreasing refractive index with increasing oxygen in the gas flow. It should be noted that the optical deposition rate is nearly, and uniquely, insensitive to % oxygen in the gas flow at high power (4 kW). Apparently, the decrease in refractive index with increasing oxygen in the gas flow is offset by the rapid increase in physical deposition rate (FIG. 6) at high power.

In the following discussion unless indicated to the contrary, the observation for haze was performed as follows. A test coated piece of glass ("coupon") was treated to affect the surface as discussed below. The coupons were individually observed with the unaided eye in a dark room with about 150 watt flood light. The coupon was placed in front of the light, and its position was adjusted relative to the light to maximize haze. The observed haze was then rated in a 12 unit system from A+ to D− with A+ being haze free. Low haze suggests that the protective layer protects the underlying coatings against non-uniform chemical degradation which in turn causes scattering of visible light.

In the following discussion reference is made to humidity exposure tests in a Cleveland Condensation Chamber (CCC). During the CCC test the coated glass is exposed to heat and condensing moisture which can cause a color change in coated glass. An obvious consequence is a change in the overall appearance of the coating, i.e., its reflected color. If exposure to moisture occurs non-uniformly over the surface area, then the extent of the above reactions and the resulting color change may vary from one region to the next. This can result in a mottled appearance and an unacceptable product.

EXAMPLES

Sample 22 was a Low-E coating stack of the type shown in FIG. 1 and was made by depositing a 225 angstrom (Å) film of zinc oxide on the air surface of a 12 inch (0.3 meter)=12 inch (0.3 meter)×0.9 inch (2.3 mm) soda lime silicate float glass piece. A silver layer about 125 Å thick (13 μg/cm2) was deposited on the zinc oxide. A primer layer of a titanium alloy (80% titanium, 20% aluminum) having a thickness of slightly less than 14 Å was deposited on the silver. A zinc oxide film having a thickness of about 55 Å was deposited on the primer film. A zinc stannate film having a thickness of 100 Angstroms was deposited on the zinc oxide followed by a silicon aluminum nitride homogeneous film having a thickness of 150 Angstroms. The silicon aluminum cathode had about 15% of aluminum by weight and was sputtered in a nitrogen atmosphere to deposit an overcoat of silicon aluminum nitride. The coating contained less aluminum (equal to or less than 11 weight percent of the total silicon and aluminum content) than the target material. Segments cut from Sample 22 were exposed to the hot salt water test and had a haze rating of A+ indicating excellent durability.

Additional samples (collectively referred to as Sample 23) were coated as described above having a silicon aluminum nitride coating in the thickness range of 140–225 Å. Each of the samples of Sample 23 shows visible color change after the hot salt water test in a side by side examination by the unaided eye. This color change may result from a uniform removal of a coating layer, e.g., silicon nitride layer, or more likely its aluminum nitride phase which is known to decompose in hot water. Alternatively, the outer layer of the nitride overcoat may react with hot water to form an oxide layer with a lower index of refraction. Both of these effects can result in a change in the color. If exposure to moisture occurs non-uniformly over the surface area, then the extent of the above reactions and the resulting color change may vary from one region to the next. This can result in a mottled appearance and an unacceptable product.

Eleven (11) test samples (Samples 24–34) each had a zinc oxide film, a silver film, a titanium-aluminum primer film, a zinc oxide film and a zinc stannate film similar to the above sample except the primer film was about 19 Å thick. A silicon aluminum oxynitride film having different thicknesses was deposited over the zinc stannate film in place of the silicon aluminum nitride film. The silicon aluminum oxynitride layer of Samples 24–34 was deposited in the oxygen/nitrogen atmosphere shown in Table 3. The total atmosphere had 4 mTorr of total pressure. Where the % oxygen flow was 0, the protective coating was silicon aluminum nitride.

The durability of the samples in the hot salt water test was as good, or better, than the pieces of Sample 23 having the silicon aluminum nitride overcoat. The Samples 24–34 of Table 3 were measured for color change by placing a sample into the hot salt solution discussed above. One half of the sample was in the solution, the other half out of the solution. A spot on the coating in the salt solution and a spot on the coating not in the salt solution were measured with a Spectrogard calorimeter. The color difference in MacAdam units is shown in column 3 of Table 3. The MacAdam unit is a measure of color difference. A high MacAdam difference indicates a layer color change as perceived by the human eye. Very significantly, low-E coatings with oxynitride overcoats improve considerably in color stability relative to Samples 24, 30 and 31 having silicon aluminum nitride overcoats. The color change with oxynitride overcoats is less than or near the limit of barely detectable color difference (e.g., one MacAdam unit). The protective layer thickness in Angstroms (Å) for the silicon aluminum oxynitride overcoat of the instant invention and for the silicon aluminum nitride coatings are listed in column (1) of Table 3 and % oxygen in the gas flow are listed in column (2). The color difference MacAdam units is listed in Column (3). The other gas in the flow was nitrogen. It can be observed from Table 3 that the color change decreases as the % oxygen in the gas flow increases. As the oxygen increases, the oxynitride in the film increases and the nitride decreases.

TABLE 3

| Sample Number | (1) Overcoat Thickness (Å) | (2) $O_2$ Flow % | (3) Color Difference in MacAdam units |
|---|---|---|---|
| 24 | 137 | 0 | 4.71 |
| 25 | 149 | 5 | 1.42 |
| 26 | 158 | 10 | 0.9 |
| 27 | 149 | 15 | 0.51 |
| 28 | 122 | 20 | 0.95 |
| 29 | 107 | 30 | 0.58 |
| 30 | 226 | 0* | 7.13 |
| 31 | 152 | 0 | 2.68 |
| 32 | 145 | 10 | 1.25 |
| 33 | 149 | 5 | 1.34 |
| 34 | 149 | 15 | 1.02 |

*Sputtered in 50% Ar—50% $N_2$ gas atmosphere.

With reference to Table 4, the aluminum loss after the hot salt water test is shown for Samples 30–34. Column (1) of Table 4 shows the percent (%) oxygen in the gas flow. Column (2) of Table 4 is the mass of aluminum in the coating layer before the salt test in $\mu g/cm^2$. Column (3) of Table 4 is the mass of aluminum after the salt test in $\mu g(Al)/cm^2$, and column (4) is the percent change (column 3−column 4/column 3). The data in Column 4 indicates that aluminum loss from the coating during the hot salt water test is less for a silicon aluminum oxynitride protective layer than for a silicon aluminum nitride protective layer. Table 4 further shows that percent change is zero as the oxygen content in the gas flow increases up to about 10%. These results are in agreement with aluminum loss studies of individual silicon aluminum oxynitride layers in Table 2 above and FIG. 5.

TABLE 4

| | | (2) | (3) | (4) |
|---|---|---|---|---|
| | | \multicolumn{2}{c}{$\mu g\ (Al)/cm^2$} | |
| Sample Number | (1) $O_2$ Flow (%) | Before Salt Test | After Salt Test | Percent Change |
| 30 | 0 | 0.41 | 0.38 | 7.3 |
| 31 | 0 | 0.33 | 0.31 | 6.1 |
| 32 | 10 | 0.20 | 0.20 | 0 |
| 33 | 5 | 0.27 | 0.26 | 3.7 |
| 34 | 15 | 0.18 | 0.18 | 0 |

Samples 35 to 39 were made and tested to determine the preferred thickness range of a protective layer of silicon aluminum oxynitride to chemically protect an underlying double silver layer coating. Along with its protection of the low-E coating, the silicon aluminum oxynitride layer which is a dielectric material also influences the reflected and transmitted color of the coated glass. As discussed previously the index of refraction of the silicon aluminum oxynitride varies as a function of the percentage of oxygen in the gas flow at a given cathode power (see Table 1). Each of the samples of Table 5 included a functional coating stack on the air side of a soda-lime silicate glass piece 12 inches (0.3 meters)×12 inches (0.3 meters)×0.092 inch (2.3 mm). The protective layer was deposited in an atmosphere of 5% oxygen and 95% nitrogen on a functional coating. The functional coating was deposited in the following order: a 310 Å thick zinc oxide film, a 92 Å thick silver film, a 7 Å thick titanium metal primer film (deposited as a metal which totally or partially oxidizes during deposition of the metal oxide layer), a 92 Å thick zinc oxide film, a 455 Å thick zinc stannate film, a 275 Å thick zinc oxide film, a 138 Å thick silver film, a 7 Å thick titanium metal primer film, a 92 Å thick zinc oxide film, a zinc stannate film and a silicon aluminum oxynitride layer. The physical thicknesses of the zinc stannate film and the silicon aluminum oxynitride layer were adjusted such that the total optical thickness of the zinc stannate film and silicon aluminum oxynitride layer was kept approximately constant at an optical thickness of about 520 Å. An $n_{550}$ of about 2 and about 1.67 were assumed for the zinc stannate and the SiAlON film, respectively.

Table 5 shows the variations in the physical thicknesses of the zinc stannate and silicon oxynitride layers for each sample and the ratings of the test coupons after various tests.

Clearly, there is a major improvement as a result of the silicon-aluminum oxynitride overcoat. The best results (in bold letters) for each test correspond to different thicknesses. For example, the protective layer in the thickness range of 50–149 Å performed the best during the acetic acid test; in the thickness range of 50–99 Å for the ammonium hydroxide test; in the thickness range of 99–198 for the sodium chloride test; 99–198 for the CCC test (5 hrs.) and 99–149 Å for the CCC test (24 hrs.).

In the practice of the invention, the protective layer has a thickness greater than zero and no maximum limit. More particularly, from Table 5, it is noted that the 50 Å thick layer of the protective layer provided benefits. It is believed that significant benefits e.g. durability of the invention may be realized at a thickness as low as about 30 Angstroms (Å). At thicknesses greater than about 250 Å, it is believed minimal increases in benefits are realized. In the practice of the

TABLE 5

| | Physical Thickness (Å) | | | $n_{550}$ | Durability Tests | | | | |
|---|---|---|---|---|---|---|---|---|---|
| Sample | Zinc Stannate | Silicon aluminum Oxynitride | Total | Silicon Aluminum Oxynitride | Acetic Acid | Ammonium Hydroxide | Sodium Chloride | CCC* (5 hr) | CCC* (24 hr) |
| 35 | 260 | 0 | 260 | — | D | C+ | C+ | B– | D+ |
| 36 | 224 | 50 | 274 | 1.44 | B+ | A– | C+ | B | C |
| 37 | 176 | 99 | 274 | 1.69 | B+ | A– | B | B+ | C+ |
| 38 | 137 | 149 | 285 | 1.65 | B+ | B+ | B+ | B+ | C+ |
| 39 | 98 | 198 | 296 | 1.64 | B | B+ | B | B+ | C |

*CCC ≡ Cleveland Condensation Chamber sample exposed to 140° F., 100% relative humidity for the time period specified.

Five (5) test coupons were cut from each of Samples 35–39. For the CCC test the coupons were 2 inches (5.08 cm) by 6 inches (15.24 cm) and the test coupons for the remaining tests were 4 inches (10.16 cm) by 1⅜ inches (3.5 cm). The test coupons were cut from the center portion of the coated samples to eliminate edge coating effects. A test coupon was used for each of the acetic acid test, the ammonium hydroxide test, the sodium chloride test, and the 24 hour CCC test.

In the acetic acid test a test coupon was submerged in a 1 normal solution of acetic acid in deionized water at room temperature for 10 minutes. The test coupon was removed from the solution and rinsed off with deionized water and blown dry using high pressure nitrogen. The test coupon was examined for haze.

In the ammonium hydroxide test a test coupon was placed in a 1 Normal solution of ammonium hydroxide in deionized water at room temperature for 10 minutes. The coupon was removed from the solution, rinsed in deionized water and dried as discussed above. The test coupon was examined for haze.

In the sodium chloride test a test coupon was placed in a 2.5% by weight sodium chloride solution in deionized water at 75° C. for 2.5 hours. The test coupon was removed, rinsed in deionized water and dried as discussed above. The test coupon was examined for haze.

The Cleveland Condensation test is a well-known test and is not discussed herein. The test coupons were exposed to the CCC test for 5 hours and 24 hours. The test coupon was examined for haze.

invention, homogeneous, non-homogeneous and graded protective layers of the instant invention within the thickness range of about 30 Å to about 250 Å are useable; ranges of about 50 Å to about 250 Å are acceptable, and ranges of about 50 Å to about 150 Å are preferred.

Silicon aluminum oxynitride has a lower index of refraction (n) than zinc stannate, silicon aluminum nitride, zinc oxide, bismuth oxide and silicon nitride. The thickness of the dielectric layer deposited on the silver layer allows for color and luminous reflectance adjustments of the silver layer. Since zinc oxide and zinc stannate have a higher index of refraction than silicon aluminum oxynitride, it is preferred to obtain the optimum thickness from the zinc oxide and zinc stannate layers and have the silicon aluminum oxynitride layer at a minimum thickness for durability. Consequently, the desired optical properties of the stack can in most instances be more economically modified with the higher index dielectric layers and the silicon aluminum oxynitride layer thickness should be adjusted primarily to optimize durability; it may also be useful in adjusting aesthetics.

It is important to note that the zinc stannate layer below the overcoat also acts as a second protective layer over the zinc oxide layer. As stated previously, zinc stannate is more durable than zinc oxide in corrosive environments. Therefore, its use immediately below the silicon oxynitride overcoat is preferable to using zinc oxide below the silicon oxynitride layer but is not limiting to the invention.

The oxynitrides of silicon aluminum provide protection for the underlying functional coating stack. It is believed that only small color changes in the salt solution immersion tests were observed because the silicon aluminum oxynitride overcoat maintains its initial composition. The use of a graded silicon aluminum oxynitride layer as an overcoat is expected to allow for composition and color stability, as well as a higher optical thickness over that of a homogeneous silicon aluminum oxynitride layer of the same physical thickness.

At the air interface, e.g. top surface 92 of the protective layer 16 (see FIG. 1), the graded index overcoat is preferably primarily an oxynitride composition to provide the maximum protection.

Table 1 has data showing the optical thickness of silicon aluminum oxynitrides (Column 4 values times Column 6 values; as a function of different oxygen flow percentages and sputtering power. This data shows that at a given target power, or example at 3 kW, as the % oxygen in the gas flow is increased, the optical thickness of the oxynitride coating decreases (note samples 2, 6, 13, 14, 19 and 20). Referring now to FIG. 6 the contour plot shows that for small percentages of oxygen in the gas flow into tho sputtering chamber during sputtering, the deposition rate of silicon containing films, in terms of Å/kW/pass, is higher than that in pure nitrogen. As the flow percentage of oxygen increases e.g. 5 to 10% depending on target power, the deposition rate begins to decrease. In the practice of the invention, it is preferred that the bottom surface 90 of the protective layer is primarily a silicon nitride composition of substantially higher index of refraction than at the top surface 92. Between the surfaces 90 and 92, the % oxygen in the gas may decrease either gradually or abruptly, depending on the coating design and deposition method. The decrease in the oxygen concentration in the film will result in a corresponding increase in the index of refraction of the protective layer. This graded composition overcoat will have a better chemical stability than a homogenous silicon nitride film and a higher optical thickness than a homogenous oxynitride film.

In practice, in an in-line production coater one chamber may be dedicated to the deposition of the overcoat. In current magnetic sputter vacuum deposition coater designs, the deposition chamber may include up to three deposition bays with each bay including one or two targets. Therefore a total of up to six targets may be available for the deposition of the homogeneous, graded, or non-homogeneous protective layer of the invention. The following approach is provided as an example for depositing the graded oxynitride protective layer but is not limiting to the invention. Through three main gas manifolds, nitrogen flows into all chambers while a controlled flow of oxygen is allowed only in the last chamber through an auxiliary gas manifold. The latter manifold is placed close to the downstream high vacuum pumping station. The target closest to this auxiliary gas manifold deposits the outermost part of the overcoat which will contain the highest level of oxygen in the overcoat. This part of the overcoat will have the lowest index of refraction within its thickness. The rest of the overcoat may contain a decreasing amount of oxygen whose concentration is primarily controlled by upstream diffusion of oxygen from the auxiliary manifold.

It is preferred in the practice of the invention to have a silicon aluminum oxynitride protective layer in place of silicon aluminum nitride because silicon aluminum oxynitride is more resistant to chemical attack. A silicon aluminum oxynitride overcoat of approximately similar thickness as a silicon aluminum nitride overcoat provides a better protection for low-E coatings, and it is expected to provide similar protection for other types of sputtered coatings.

The foregoing discussion and test results are applicable for silicon oxynitride protective layers as well as silicon aluminum oxynitride layers. As can now be appreciated the invention is not limited to the above examples which were presented for illustration purposes only and are not limiting to the invention. The scope of the invention is defined in the following claims.

What is claimed is:

1. A coated article of the type having a coating comprising an infrared reflecting metal film between dielectric films over a surface of a substrate and a protective layer over the coating, the improvement comprising:

wherein the protective layer is a sputter coated silicon oxynitride coating having the following formula $$Si_{3-2x}O_{2x}N_{4-4x}$$

where X is greater than 0 and less than 1 and having a composition, or mixture of a single phase or phases containing silicon, oxygen, nitrogen and a conductive element selected from the group consisting of aluminum, boron and a transitional metal wherein the weight of the conductive element is greater than 1% and less than 25% of the total weight of the silicon and the conductive element.

2. The coated article according to claim 1 wherein the protective coating is homogeneous.

3. The coated article according to claim 1 wherein the protective coating is graded.

4. The coated article according to claim 1 wherein the protective coating is non-homogeneous.

5. The coated article according to claim 1 wherein the thickness of the protective layer is between 50 and 200 Angstroms.

6. The coated article according to claim 1 wherein the coating has at least two infrared reflecting metal films, each of the reflecting metal films is between a pair of dielectric films.

7. The coated article according to claim 1 wherein the dielectric films are metal oxide films and further including a primer film between the metal film and one of the metal oxide films and the primer film is eighty percent by weight titanium and twenty percent by weight aluminum.

8. The coated article according to claim 1 wherein the protective layer is a silicon aluminum oxynitride coating.

9. A coated article of the type having a coating comprising an infrared reflecting metal film between dielectric films on a substrate and a protective layer over the coating, the improvement comprising:

wherein the protective layer is a sputter coated silicon oxynitride coating having the following formula $$Si_{4-2x}O_{2x}N_{4-4x}$$

where x is greater than 0 and less than 1; and having a composition, or mixture of a single phase or phases containing silicon, oxygen, nitrogen and a conductive element selected from the group consisting of aluminum, boron and a transitional metal wherein the weight of the conductive element is greater than 1% and less than 25% of the total weight of the silicon and the conductive element, and an outer film wherein the surface of the protective layer farthest from the substrate is in contact with the outer film.

10. The coated article according to claim 9 wherein the outer film is silicon nitride.

11. The coated article according to claim 9 wherein the outer film is silicon dioxide.

12. The coated article according to claim 9 wherein the outer film is zinc oxide.

13. A coated article of the type having a functional sputter coated layer over a substrate and a protective layer having a first surface and an opposite surface defined as a second surface with the second surface facing and over the functional layer, the improvement comprising wherein the first surface of the protective layer is the outermost surface of the coated article and the protective layer has chemical and mechanical durability and is a graded layer.

14. A coated article of the type having a functional sputter coated layer over a substrate and a protective layer having a first surface and an opposite surface defined as a second surface with the second surface facing and over the functional layer, the improvement comprising wherein the first surface of the protective layer is the outermost surface of the coated article and the protective layer has chemical and mechanical durability, is a graded layer and is a silicon oxynitride layer having the following formula:

$$Si_{3-2x}O_{2x}N_{4-4x}$$

wherein x is greater than 0 and less than 1.

15. The coated article according to claim 14 wherein the silicon oxynitride layer is a composition, or mixture of a single phase or phases containing silicon, oxygen, nitrogen and a transitional metal.

16. The coated article according to claim 15 wherein the protective layer is a silicon aluminum oxynitride coating.

17. The coated article according to claim 14 wherein the functional coating is a coating having at least one combination of an infrared reflective metal film between a pair of dielectric films.

18. The coated article according to claim 17 wherein a primer film is between at least one of the metal films and one of the dielectric films.

19. The coated article according to claim 13 wherein the protective layer has a different index of infraction moving from one surface of the gradient layer to the opposite surface of the gradient layer.

20. A coated article of the type having a functional sputter coated layer over a substrate and a protective layer having a first surface and an opposite surface defined as a second surface with the second surface facing and over the functional layer, the improvement comprising wherein the first surface is the outermost surface of the coated article and the protective layer having chemical and mechanical durability and is a non-homogeneous layer.

21. A coated article of the type having a functional sputter coated layer over a substrate and a protective layer having a first surface and an opposite surface defined as a second surface with the second surface facing and over the functional layer, the improvement comprising wherein the first surface is the outermost surface of the coated article and the protective layer has chemical and mechanical durability, is a non-homogeneous layer, and is a silicon oxynitride layer having the following formula:

$$Si_{3-2x}O_{2x}N_{4-4x}$$

wherein x is greater than 0 and less than 1.

22. The coated article according to claim 21 wherein the silicon oxynitride coating is a composition, or mixture of a single phase or phases containing silicon, oxygen, nitrogen and a transitional metal.

23. The coated article according to claim 22 wherein the protective layer is a silicon aluminum oxynitride coating.

24. The coated article according to claim 21 wherein the functional coating is a coating having at least one combination of an infrared reflective metal film between a pair of dielectric films.

25. The coated article according to claim 24 wherein a primer film is between at least one of the metal films and one of the dielectric films.

26. The article according to claim 20 wherein the index of refraction of the protective layer is non-uniform throughout its thickness.

27. A coated article of the type having a functional sputter coating over a substrate and a protective layer having a first surface and an opposite surface defined as a second surface with the second surface over the functional coating, the improvement comprising wherein the protective layer has chemical and mechanical durability and is a graded layer and an outer film on and in contact with the first surface of the protective layer.

28. The coated article according to claim 27 wherein the outer film is silicon nitride.

29. The coated article according to claim 27 wherein the outer film is silicon dioxide.

30. The coated article according to claim 27 wherein the outer film is zinc oxide.

31. A coated article of the type having a functional sputter coating on a substrate and a protective layer having a first surface and an opposite surface defined as a second surface with the second surface over the functional coating, the improvement comprising wherein the protective layer has chemical and mechanical durability and is a non-homogeneous layer and an outer film on and in contact with the first surface of the protective layer.

32. The coated article according to claim 31 wherein the outer film is silicon nitride.

33. The coated article according to claim 31 wherein the outer film is silicon dioxide.

34. The coated article according to claim 31 wherein the outer film is zinc oxide.

* * * * *